United States Patent
Liu et al.

(10) Patent No.: US 10,744,737 B2
(45) Date of Patent: Aug. 18, 2020

(54) ELECTRONIC APPARATUSES AND METHODS FOR MANUFACTURING AN ELECTRONIC APPARATUS

(71) Applicant: BOE Technology Group Co., Ltd., Beijing (CN)

(72) Inventors: Lu Liu, Beijing (CN); Weifeng Zhou, Beijing (CN); Shanchen Kao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 192 days.

(21) Appl. No.: 15/818,152

(22) Filed: Nov. 20, 2017

(65) Prior Publication Data

US 2018/0304575 A1    Oct. 25, 2018

(30) Foreign Application Priority Data

Apr. 19, 2017 (CN) .......................... 2017 1 0259583

(51) Int. Cl.
*B32B 3/26* (2006.01)
*B32B 38/10* (2006.01)
(Continued)

(52) U.S. Cl.
CPC .............. *B32B 3/266* (2013.01); *B32B 38/10* (2013.01); *H01L 51/0097* (2013.01);
(Continued)

(58) Field of Classification Search
CPC ... B32B 3/266; B32B 38/10; B32B 2309/105; B32B 2457/20; B32B 2310/0843;
(Continued)

(56) References Cited

U.S. PATENT DOCUMENTS

2002/0171080 A1* 11/2002 Faris .................... B81C 1/0038
257/40
2011/0019278 A1    1/2011 Aoki
(Continued)

FOREIGN PATENT DOCUMENTS

| CN | 101982031 A | 2/2011 |
| CN | 104835415 A | 8/2015 |

(Continued)

OTHER PUBLICATIONS

First Office Action, including Search Report, for Chinese Patent Application No. 201710259583.3, dated Nov. 30, 2018, 11 pages.

*Primary Examiner* — Michael N Orlando
*Assistant Examiner* — Christopher W Raimund
(74) *Attorney, Agent, or Firm* — Westman, Champlin & Koehler, P.A.

(57) ABSTRACT

The present disclosure proposes a method for manufacturing an electronic apparatus and a corresponding electronic apparatus. The method comprises: removing a back film in a first region of a flexible substrate; and bending the flexible substrate in the first region to form an electronic apparatus having a bending portion. The electronic apparatus comprises: a flexible substrate having a bending portion in a first region thereof; and a back film bonded to a region of a back surface of the flexible substrate except for the first region.

2 Claims, 3 Drawing Sheets

(51) Int. Cl.
  *H01L 51/00*   (2006.01)
  *G02F 1/1333*  (2006.01)
  *H01L 27/32*   (2006.01)

(52) U.S. Cl.
  CPC . *B32B 2309/105* (2013.01); *B32B 2310/0843* (2013.01); *B32B 2457/20* (2013.01); *G02F 1/133305* (2013.01); *H01L 27/3241* (2013.01)

(58) Field of Classification Search
  CPC ............ H01L 51/0097; H01L 27/3241; G02F 1/133305; G09F 9/301; H05K 1/028
  See application file for complete search history.

(56) References Cited

U.S. PATENT DOCUMENTS

| | | |
|---|---|---|
| 2014/0183473 A1 | 7/2014 | Lee et al. |
| 2015/0227172 A1 | 8/2015 | Namkung et al. |
| 2016/0093683 A1 | 3/2016 | Lee et al. |
| 2016/0174358 A1* | 6/2016 | Wu ........................ H05K 1/028 174/254 |
| 2016/0351859 A1 | 12/2016 | Ko et al. |
| 2017/0042047 A1 | 2/2017 | Oh |
| 2017/0062773 A1 | 3/2017 | Lee et al. |
| 2018/0076400 A1* | 3/2018 | Jung ........................ B32B 27/30 |
| 2018/0224894 A1 | 8/2018 | Namkung et al. |
| 2019/0051753 A1 | 2/2019 | Ko et al. |

FOREIGN PATENT DOCUMENTS

| | | |
|---|---|---|
| CN | 104885140 A | 9/2015 |
| CN | 106450024 A | 2/2017 |
| CN | 206003771 U | 3/2017 |
| KR | 10-2016-0141929 A | 12/2016 |

\* cited by examiner

ELECTRONIC APPARATUSES AND METHODS FOR MANUFACTURING AN ELECTRONIC APPARATUS

CROSS-REFERENCE TO RELATED APPLICATION(S)

The present application claims priority to the Chinese Patent Application No. 201710259583.3, filed on Apr. 19, 2017, which is incorporated herein by reference in its entirety.

TECHNICAL FIELD

The present disclosure relates to the field of industrial production, and more particularly, to an electronic apparatus and a method for manufacturing an electronic apparatus.

BACKGROUND

Compared with common flat panel displays, flexible displays are primarily characterized in that they are soft and bendable electronic displays. With the increasing demands for narrow bezels on the market today, it is desired that the bezels have reduced widths. With the current capability and state of the devices, it is difficult to narrow the bezels of the flexible display devices.

SUMMARY

The present disclosure provides an electronic apparatus and a method for manufacturing an electronic apparatus.

According to a first aspect of the present disclosure, there is provided an electronic apparatus. The electronic apparatus comprises: a flexible substrate having a bending portion in a first region thereof; and a back film bonded to a region of a back surface of the flexible substrate except for the first region.

In an example, the electronic apparatus further comprises: a bonding layer which is bonded between the flexible substrate and the back film. In some embodiments, the flexible substrate has a thickness of 5 micrometers to 30 micrometers.

In an example, the back film has a thickness of 50 micrometers to 200 micrometers approximately. In some embodiments, the bonding layer has a thickness of 50 micrometers to 150 micrometers approximately. In an example, the electronic apparatus is a display device, and a bezel of the display device has a width less than or equal to 2 millimeters approximately.

According to a second aspect of the present disclosure, there is provided a method for manufacturing an electronic apparatus. The method comprises: removing a back film in a first region of a flexible substrate; and bending the flexible substrate in the first region to form an electronic apparatus having a bending portion.

In an example, the step of removing a back film in a first region of a flexible substrate comprises: cutting off the back film in the first region of the flexible substrate using a laser. In an example, before the step of removing a back film in a first region of a flexible substrate, the method further comprises: removing a decomposition layer in the first region which is located between the flexible substrate and the back film. In an example, the decomposition layer is made of a photodecomposition material or a thermal decomposition material. In an example, the step of removing a decomposition layer in the first region which is located between the flexible substrate and the back film comprises: irradiating or heating the decomposition layer in the first region, so that a decomposition gas of the decomposition layer is discharged through an air hole on the back film. In an example, the air hole is formed by perforating the back film using a laser. In an example, before the step of removing a decomposition layer in the first region which is located between the flexible substrate and the back film, the method further comprises: bonding the back film to a back surface of the flexible substrate. In an example, the step of bonding the back film to a back surface of the flexible substrate comprises: patterning a bonding layer on the back film, so that there is no adhesive in a second region of the bonding layer which corresponds to the first region of the flexible substrate; filling the second region of the bonding layer with a photodecomposition material or a thermal decomposition material, to form a decomposition layer which is flush with the bonding layer; and aligning and fitting the bonding layer having the decomposition layer to the back surface of the flexible substrate, so that the first region of the flexible substrate is aligned with the second region of the bonding layer. In an example, before the step of aligning and fitting the bonding layer having the decomposition layer to the back surface of the flexible substrate, the method further comprises: peeling the flexible substrate off a supporting substrate.

BRIEF DESCRIPTION OF THE DRAWINGS

The above and other purposes, features and advantages of the present disclosure will become more apparent from the following description of the preferred embodiments of the present disclosure, taken in conjunction with the accompanying drawings, in which.

DETAILED DESCRIPTION

Figure 1:
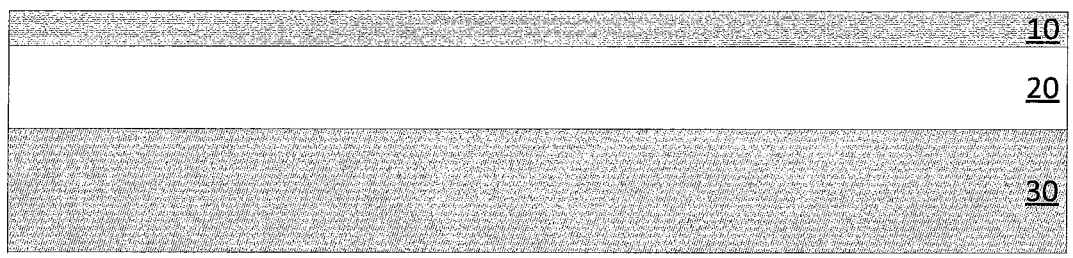
FIG. 1 is a partial cross-sectional view illustrating an exemplary flexible display according to an embodiment of the present disclosure.

Preferred embodiments of the present disclosure will be described in detail below with reference to the accompanying drawings, in which details and functions which are not necessary for the present disclosure are omitted in the description in order to prevent confusion in the understanding of the present disclosure. In the present specification, the following description of various embodiments for describing the principles of the present disclosure is illustrative only and should not be construed as limiting the scope of the disclosure in any way. The following description with reference to the accompanying drawings is provided to assist in a comprehensive understanding of the exemplary embodiments of the disclosure as defined by the claims and their equivalents. The following description includes many specific details to assist in the understanding, but such details are to be regarded as merely exemplary. Accordingly, those of ordinary skill in the art will recognize that numerous changes and modifications can be made to the embodiments described herein without departing from the scope and spirit of the present disclosure. In addition, descriptions of well-known functions and structures are omitted for clarity and conciseness. In addition, the same reference numerals are used for the same or similar functions and operations throughout the accompanying drawings. In addition, in the accompanying drawings, various parts are not necessarily drawn to scale. In other words, relative sizes, lengths, etc. of the various parts in the accompanying drawings do not necessarily correspond to practical proportions.

Hereinafter, the present disclosure is described in detail by using a scene in which the present disclosure is applied to a flexible display device as an example. However, the present disclosure is not limited thereto. The present disclosure may also be applied to any other suitable electronic apparatus, for example, any flexible electronic apparatus which needs a narrow bezel or a flexible electronic apparatus which needs to be bent. In addition, although the technical solutions according to the embodiments of the present disclosure are described in detail below using a "back film" as an example, they also apply to other layers bonded to the flexible substrate, as long as cutting, bending, etc. of the layers does not affect their essential functions or essential functions of other elements.

In the present disclosure, terms "include" and "contain" and their derivatives are intended to be inclusive and not restrictive, and the term "or" is inclusive, meaning and/or.

In addition, in the following description of the present disclosure, oriental terms which are used such as "up," "down," "left," "right," etc. are used to indicate relative positional relationships to assist those skilled in the art in understanding the embodiments of the present disclosure. Therefore, those skilled in the art should understand that "up"/"down" in one direction may be changed to "down"/"up" in an opposite direction and may be changed to another positional relationship in another direction, such as "left"/"right" etc.

A solution of manufacturing a flexible display with a narrow bezel according to an embodiment of the present disclosure will be described in detail below with reference to FIG. 1 and FIG. 2.

FIG. 1 is a partial cross-sectional view illustrating an exemplary flexible display 1 according to an embodiment of the present disclosure. More specifically, FIG. 1 illustrates an edge portion before forming a narrow bezel portion of the flexible display 1, wherein a left side of FIG. 1 is the edge portion, and a right side of the flexible display 1 is not completely shown, and may have other components thereon.

As shown in FIG. 1, the flexible display 1 may at least comprise a flexible substrate 10, a bonding layer 20 and a back film 30. In the embodiment illustrated in FIG. 1, the flexible substrate 10 may be a polyimide (PI for short) substrate. However, the present disclosure is not limited thereto, and the flexible substrate 10 may also be made of other flexible materials, for example, PolyEther Ether Ketone (PEEK for short), Polyesterfilm etc. In addition, as described above, other devices or layers, such as a common electrode, a gate, a source-drain, a passivation layer, a pixel electrode etc. may have been manufactured on the flexible substrate 10. However, the presence or absence of these devices or layers does not affect the implementation of the technical solutions according to the embodiment of the present disclosure, and thus the description thereof will be omitted.

As shown in FIG. 1, the flexible substrate 10 may be relatively fixed to the back film 30 through the bonding layer 20. In the embodiment illustrated in FIG. 1, the bonding layer 20 may be made of, for example, Optical Clear Adhesive (OCA for short), such as, acrylic adhesive etc. However, the present disclosure is not limited thereto, and the bonding layer 20 may also be made of other adhesives, for example, Pressure Sensitive Adhesive (PSA for short) etc.

In the embodiment illustrated in FIG. 1, the back film 30 may be used to balance stress and protect the flexible substrate 10. The back film 30 may have a thickness which is 5 to 15 times as large as a thickness of the flexible substrate 10. In the embodiment illustrated in FIG. 1, the flexible substrate 10 may have a thickness of 5 micrometers to 30 micrometers approximately, the back film 30 may have a thickness of 50 micrometers to 200 micrometers approximately, and the bonding layer 20 may have a thickness of 50 micrometers to 150 micrometers approximately. However, the present disclosure is not limited thereto. In addition, in some embodiments, the back film 30 may be fully transparent or translucent.

Figure 2:
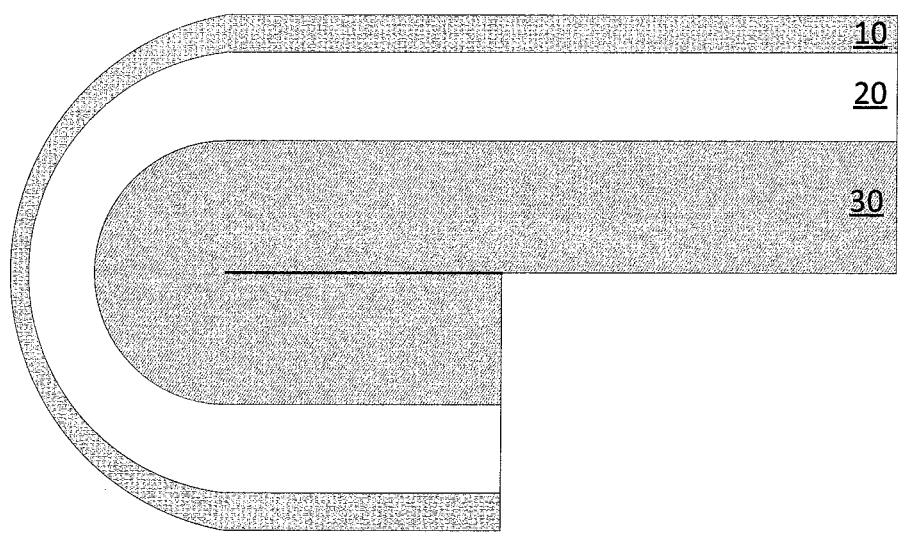
FIG. 2 is a partial cross-sectional view illustrating an exemplary flexible display which is bent according to an embodiment of the present disclosure.

In order to reduce a width of the bezel of the flexible display 1, the flexible substrate 10 may be bent down to a back surface of the flexible display 1 together with the bonding layer 20 and the back film 30, as shown in FIG. 2. FIG. 2 illustrates a partial cross-sectional view of the exemplary flexible display 1 which is bent according to an embodiment of the present disclosure. As shown in FIG. 2, the flexible substrate 10 is bent to the back surface of the flexible display 1, so that a size of the bezel can be greatly reduced, thereby manufacturing the flexible display 1 with a narrow bezel.

However, as the bonding layer 20 and the back film 30 are simultaneously bent in addition to the flexible substrate 10, the flexible substrate 10 may be pressed. As shown in FIG. 2, it can be seen that the flexible substrate 10 is significantly pressed and is slightly deformed. In this case, metal wires on the flexible substrate 10 are greatly stressed, which may cause breakage (open circuit) and peeling of metal lines on an upper layer, and even cause tearing of film layers.

A technical solution according to another embodiment of the present disclosure is proposed. This solution will be described in detail below with reference to FIGS. 3 to 6.

Figure 3:
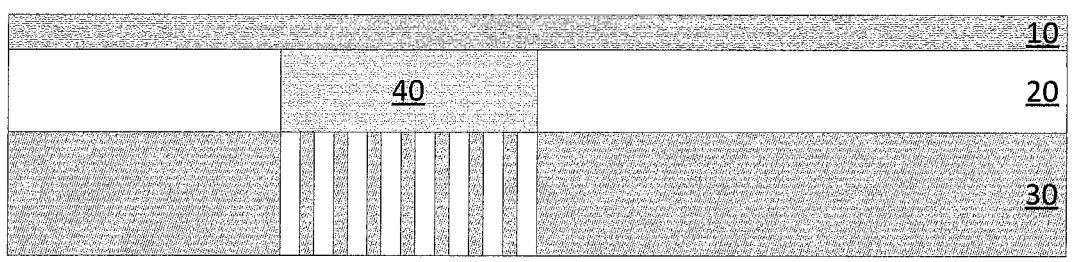
FIG. 3 is a partial cross-sectional view illustrating an exemplary flexible display according to another embodiment of the present disclosure.
Figure 4:
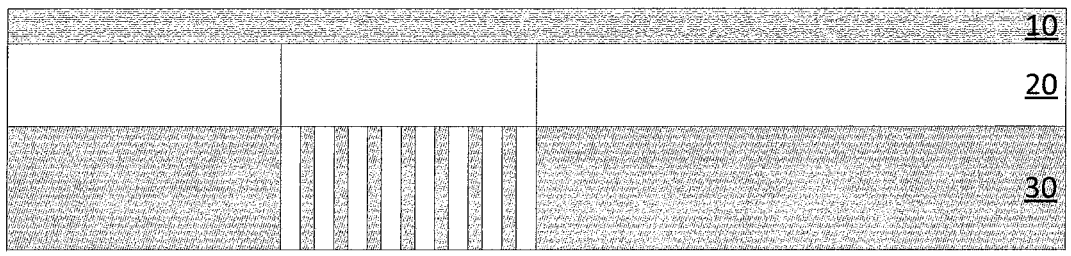
FIG. 4 is a partial cross-sectional view illustrating an exemplary flexible display which is decomposed according to another embodiment of the present disclosure.

FIG. 3 is a partial cross-sectional view illustrating an exemplary flexible display 2 according to another embodiment of the present disclosure.

Similarly to the flexible display 1 illustrated in FIG. 1, the flexible display 2 may also comprise a flexible substrate 10, a bonding layer 20 and a back film 30. In the embodiment illustrated in FIG. 3, the flexible substrate 10 may also be a polyimide (PI for short) substrate. However, the present disclosure is not limited thereto, and the flexible substrate 10 may also be made of other flexible materials, for example, PolyEther Ether Ketone (PEEK for short), Polyesterfilm etc. In addition, other devices or layers, such as a common electrode, a gate, a source-drain, a passivation layer, a pixel electrode etc. may have been manufactured on the flexible substrate 10. However, the presence or absence of these devices or layers does not affect the implementation of the technical solutions according to the embodiment of the present disclosure, and thus the description thereof will be omitted.

As shown in FIG. 3, the flexible substrate 10 may also be relatively fixed to the back film 30 through the bonding layer 20. Similarly to FIG. 1, the bonding layer 20 illustrated in FIG. 3 may also be made of, for example, Optical Clear Adhesive (OCA for short), such as, acrylic adhesive etc. However, the present disclosure is not limited thereto, and the bonding layer 20 may also be made of other adhesives, for example, Pressure Sensitive Adhesive (PSA for short) etc.

In the embodiment illustrated in FIG. 3, similarly to FIG. 1, the back film 30 may also be used to balance stress and protect the flexible substrate 10. The back film 30 may have a thickness which is 5 to 15 times as large as a thickness of the flexible substrate 10. In the embodiment shown in FIG. 3, the flexible substrate 10 may have a thickness of 5 micrometers to 30 micrometers approximately, the back film 30 may have a thickness of 50 micrometers to 200 micrometers approximately, and the bonding layer 20 may have a thickness of 50 micrometers to 150 micrometers approximately. However, the present disclosure is not limited thereto. In addition, in some embodiments, the back film 30 may be fully transparent or translucent.

As described with reference to the embodiments in FIG. 1 and FIG. 2, if the flexible substrate 10 is directly bent together with the bonding layer 20 and the back film 30, the flexible substrate 10 may be greatly stressed, which may cause problems thereon such as breakage of metal wires, tearing of film layers etc. For this reason, in the embodiment illustrated in FIG. 3, a decomposition layer 40 is formed in a region (a second region) of the bonding layer 20 which corresponds to a portion to be bent (a first region) of the flexible substrate 10. In addition, a perforation process is performed in a region (a third region) of the back film 30 which corresponds to a portion to be bent (the first region) of the flexible substrate 10 to form one or more air holes.

More specifically, in a production flow of the flexible display 2, before the flexible substrate 10 is bonded to the back film 30 using the bonding layer 20, adhesive may be coated on the back film 30 to form the bonding layer 20. When the adhesive is coated, the adhesive may be coated by a pattern coating method (for example, by punching the adhesive), so that there is no adhesive in the second region of the bonding layer 20 which corresponds to the first region of the flexible substrate 10. This second region may then be filled with a thermal decomposition material or a photodecomposition material to form a decomposition layer 40 which is flush with the bonding layer 20. For example, thicknesses of the decomposition layer 40 and the bonding layer 20 may be controlled by controlling coating parameters during the coating process, so that surfaces of both the decomposition layer 40 and the bonding layer 20 are flush with each other to facilitate subsequent processes. In some embodiments, a slot-die coating process may be used and the thicknesses of both the decomposition layer 40 and the bonding layer 20 may be controlled by adjusting a coating blade.

In some other embodiments, the adhesive may also be firstly patterned by punching the adhesive and then is aligned and fit to the back film 30 of which the first region has the decomposition material (decomposition layer 40) coated therein.

In the embodiment illustrated in FIG. 3, the decomposition layer 40 may be made of a photosensitive resin containing a diazo group or an azide group. The decomposition layer 40 may be decomposed under irradiation of a laser at a wavelength of 190 nm to 365 nm. Intensity of the laser may be adjusted according to the thickness of the decomposition layer 40. However, the present disclosure is not limited thereto. In fact, any thermal decomposition material or photodecomposition material may be used to manufacture the decomposition layer 40.

The flexible substrate 10 may be peeled off a supporting substrate when or before or after the back film 30 and the bonding layer 20 are prepared. The supporting substrate is used to provide rigid support for the flexible substrate when other devices on the flexible substrate 10 are manufactured, to facilitate manufacturing the other devices. When the other devices on the flexible substrate 10 have been manufactured, the flexible substrate 10 may be peeled off the supporting substrate as described above.

Next, the back film 30 which is coated with the bonding layer 20 in the previous step is aligned and fit to the flexible substrate 10 which is peeled, so that the portion to be bent of the flexible substrate 10, i.e., the first region, is aligned with the second region of the bonding layer 20.

In addition, as described above, a perforation process may be performed in the region (the third region) of the back film 30 which corresponds to the portion to be bent (the first region) of the flexible substrate 10 to form one or more air holes. In some embodiments, the perforation process may be performed before or after the flexible substrate 10 is bonded to the back film 30. In addition, the perforation process may be performed before or after the adhesive is coated on the back film 30. In some embodiments, the perforation process may be realized using a laser or through a punching process.

At this point, a part of the flexible display 2 illustrated in FIG. 3 can be obtained. Next, the portion to be bent (or more specifically, the second region or the decomposition layer 40) of the flexible display 2 is decomposed. In an embodiment in which the decomposition layer 40 is of a photodecomposition material, as the back film 30 may be fully transparent or translucent, the decomposition layer 40 may be irradiated through the back film 30 to decompose the photosensitive resin in the decomposition layer 40. Alternatively, in an embodiment in which the decomposition layer 40 is of a thermal decomposition material, the decomposition layer 40 may also be heated through the back film 30 so that the decomposition layer 40 is thermally decomposed into a gas. In either case, the decomposed gas may be discharged through the holes on the back film 30 to form a state shown in FIG. 4. Specifically, irradiation intensity, irradiation time, a heating temperature, heating time etc. may be set according to practical requirements, so that the decomposition layer 40 is decomposed without any damage to other portions, which is not specifically limited in the present disclosure.

Then, the portion (the third region) of the back film 30 which corresponds to the first region of the flexible substrate 10 may be removed. For example, the third region may be cut using a laser. In some embodiments, the third region may have a width of 1 millimeter to 3 millimeters. For example, a carbon dioxide laser having a wavelength of 930 nm to 1030 nm, a pico laser having a wavelength of 515 nm, or a femtosecond laser having a wavelength of 1030 nm may be used. In addition, the laser which is used should have energy to enable the back film 30 to be cut without any damage to the flexible substrate 10. The energy may be adjusted automatically according to specific situations, which is not specifically limited in the present disclosure.

Figure 5:
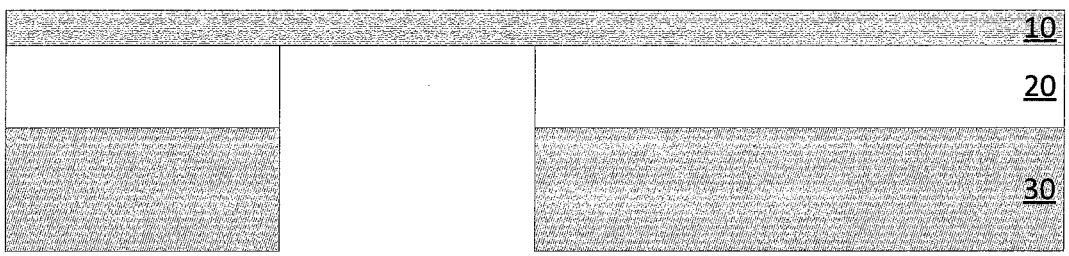
FIG. 5 is a partial cross-sectional view illustrating an exemplary flexible display which is cut according to another embodiment of the present disclosure.
Figure 6:
FIG. 6 is a partial cross-sectional view illustrating an exemplary flexible display which is bent according to another embodiment of the present disclosure.

After the cutting process, a state shown in FIG. 5 may be obtained. In this case, the first region of the flexible substrate 2 is bent in a manner similar to that shown in FIG. 2, so that a narrow bezel portion of the flexible display 2 illustrated in FIG. 6 can be formed. As shown in FIG. 6, the bending portion (the first region) of the flexible substrate 10 is not pressed by the bonding layer 20 and/or the back film 30, and thus stress applied to the flexible substrate 10 is far less than stress applied to the flexible substrate 10 in the embodiment shown in FIG. 2. In this way, problems such as breakage of the metal wires and tearing of the film layers on the flexible substrate 10 can be avoided.

The flexible substrate 10 is bent backward to the back surface of the display 2 in the manner described above, so that a width of the entire bezel can be reduced to 2 mm or less with a reduction ratio of 50% to 80% approximately.

Figure 7:
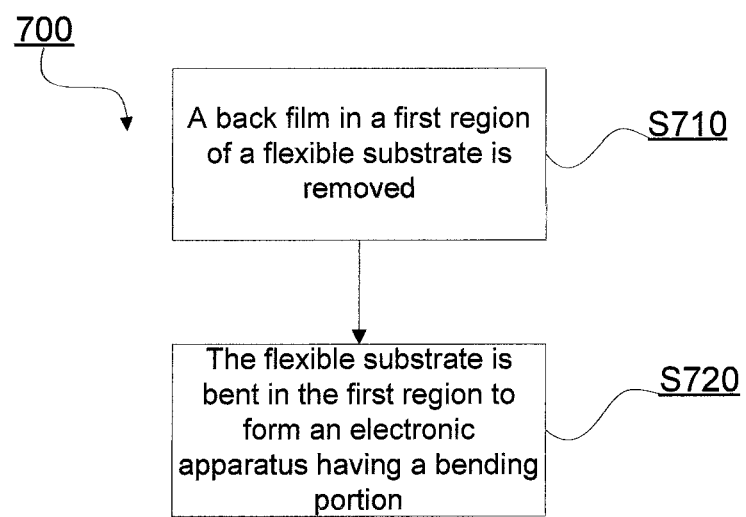
FIG. 7 is a flowchart illustrating an exemplary method for manufacturing an electronic apparatus according to another embodiment of the present disclosure.

FIG. 7 is a flowchart illustrating an exemplary method 700 for manufacturing an electronic apparatus according to another embodiment of the present disclosure. As shown in FIG. 7, the method 700 may comprise steps S710 and S720. According to the present disclosure, some steps of the method 700 may be performed separately or in combination, and may be performed in parallel or sequentially, and the present disclosure is not limited to the specific operation sequence shown in FIG. 7.

The method 700 according to another embodiment of the present disclosure will be described in detail below with reference to FIGS. 3 to 6 and FIG. 7.

The method 700 begins at step S710, in which a back film in a first region of a flexible substrate 10 may be removed.

In step S720, the flexible substrate 10 may be bent in the first region to form an electronic apparatus having a bending portion.

In some embodiments, step S710 may comprise cutting off the back film in the first region of the flexible substrate using a laser. The back film is cut off using the laser, so that irradiation time and intensity of the laser can be controlled, thereby improving the cutting accuracy and preventing the flexible substrate 10 from being damaged. In addition, in some embodiments, before step S710, the method 700 may further comprise removing a decomposition layer 40 in the first region between the flexible substrate 10 and the back film 30. The decomposition layer 40 which is used in place of a bonding layer 20 is further removed, which can further reduce stress applied to the flexible substrate 10 at a position where it is bent and further reduce the possibility of problems such as breakage of metal wires on the flexible substrate 10 and tearing of film layers etc. on the flexible substrate 10.

In some embodiments, the decomposition layer 40 may be made of a photodecomposition material or a thermal decomposition material. The photodecomposition material or the thermal decomposition material is used in place of adhesive, so that on the one hand it can be decomposed and removed in subsequent processes and on the other hand the existing process may not be changed significantly. In some embodiments, the step of removing the decomposition layer 40 in the first region which is located between the flexible substrate 10 and the back film 30 may comprise: irradiating or heating the decomposition layer 40 in the first region, so that a decomposed gas of the decomposition layer 40 is discharged through an air hole on the back film 30. The decomposed gas generated by the decomposition layer 40 is discharged through the air hole, so that the problems such as tearing of the film layers which may occur due to failure in discharge of the decomposed gas can be avoided. In some embodiments, the air hole may be formed by perforating in the back film 30 using a laser. Similarly, the perforation process is performed using the laser, so that irradiation time and intensity of the laser can be controlled, thereby improving the perforation accuracy and preventing the flexible substrate 10 from being damaged.

In some embodiments, before the step of removing the decomposition layer 40 in the first region which is located between the flexible substrate 10 and the back film 30, the method 700 further comprise: bonding the back film 30 to a back surface of the flexible substrate 10. In some embodiments, the step of bonding the back film 30 to a back surface of the flexible substrate 10 may comprise: patterning the bonding layer 20 on the back film 30, so that there is no adhesive in a second region of the bonding layer 20 which corresponds to the first region of the flexible substrate 10; filling the second region of the bonding layer 20 with a photodecomposition material or a thermal decomposition material, to form a decomposition layer 40 which is flush with the bonding layer 20; and aligning and fitting the bonding layer 20 having the decomposition layer 40 to the back surface of the flexible substrate 10, so that the first region of the flexible substrate 10 is aligned with the second region of the bonding layer 20. In some embodiments, before the step of aligning and fitting the bonding layer 20 having the decomposing layer 40 to the back surface of the flexible substrate 10, the method 700 may further comprise: peeling the flexible substrate 10 off a supporting substrate. The flexible substrate 10 can be bent backward to a back surface of the display 2 through the above processes without significantly changing the existing process flow, and stress applied to the flexible substrate 10 when the flexible substrate 10 is bent is reduced, which prevents the flexible substrate 10 from being damaged.

The present disclosure has thus far been described in connection with the preferred embodiments. It should be understood that various other changes, substitutions and additions can be made by those skilled in the art without departing from the spirit and scope of the present disclosure. Therefore, the scope of the present disclosure is not limited to the specific embodiments described above, but should be defined by the appended claims.

In addition, the functions described herein as being implemented by pure hardware, pure software, and/or firmware may also be implemented by using dedicated hardware, a combination of general hardware and software etc. For example, functions described as being implemented by dedicated hardware (for example, Field Programmable Gate Arrays (FPGAs), Application Specific Integrated Circuits (ASICs), etc.) may be implemented by a combination of general hardware (for example, Central Processing Units (CPUs), Digital Signal Processors (DSPs)) and software, and vice versa.

We claim:

1. A method for manufacturing an electronic apparatus, comprising:
    coating an adhesive on a back film to form a bonding layer;
    bonding the back film to a back surface of a flexible substrate;
    removing the back film in a first region of the flexible substrate; and
    bending the flexible substrate in the first region to form an electronic apparatus having a bending portion;
    wherein bonding the back film to a back surface of a flexible substrate further comprises:
    patterning the bonding layer on the back film, so that there is no adhesive in a second region of the bonding layer which corresponds to the first region of the flexible substrate;

filling the second region of the bonding layer with a photodecomposition material or a thermal decomposition material, to form a decomposition layer which is flush with the bonding layer; and aligning and fitting the bonding layer having the decomposition layer to the back surface of the flexible substrate, so that the first region of the flexible substrate is aligned with the second region of the bonding layer;

wherein removing the back film in a first region of the flexible substrate comprises:

cutting off the back film in the first region of the flexible substrate using a laser after the step of patterning the bonding layer on the back film so that there is no adhesive in the second region of the bonding layer which corresponds to the first region of the flexible substrate;

wherein before the step of removing the back film in a first region of the flexible substrate, the method further comprises:

removing the decomposition layer in the first region which is located between the flexible substrate and the back film, by irradiating or heating the decomposition layer in the first region so that a decomposition gas of the decomposition layer is discharged through an air hole on the back film, wherein the air hole is formed by perforating the back film using a laser.

2. The method according to claim 1, wherein before the step of aligning and fitting the bonding layer having the decomposition layer to the back surface of the flexible substrate, the method further comprises:

peeling the flexible substrate off a supporting substrate.

* * * * *